(12) United States Patent
Khlat et al.

(10) Patent No.: US 10,735,045 B2
(45) Date of Patent: Aug. 4, 2020

(54) DIPLEXER CIRCUIT

(71) Applicant: Qorvo US, Inc., Greensboro, NC (US)

(72) Inventors: Nadim Khlat, Cugnaux (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 52 days.

(21) Appl. No.: 16/103,171

(22) Filed: Aug. 14, 2018

(65) Prior Publication Data

US 2019/0326944 A1    Oct. 24, 2019

Related U.S. Application Data

(60) Provisional application No. 62/661,452, filed on Apr. 23, 2018.

(51) Int. Cl.
*H01P 1/213* (2006.01)
*H03H 7/46* (2006.01)
*H04B 1/52* (2015.01)

(52) U.S. Cl.
CPC .............. *H04B 1/52* (2013.01); *H01P 1/213* (2013.01); *H03H 7/461* (2013.01); *H03H 7/463* (2013.01)

(58) Field of Classification Search
CPC .......... H03H 7/461; H03H 7/463; H04B 1/52; H01P 1/213
USPC ....................................................... 333/117
See application file for complete search history.

(56) References Cited

U.S. PATENT DOCUMENTS

| | | |
|---|---|---|
| 3,593,208 A | 7/1971 | Smith |
| 4,216,446 A | 8/1980 | Iwer |
| 5,180,999 A * | 1/1993 | Edwards .................. H03H 7/01 333/117 |
| 6,484,012 B1 | 11/2002 | Nche et al. |
| 6,924,715 B2 | 8/2005 | Beaudin et al. |
| 7,394,333 B2 | 7/2008 | Ezzeddine et al. |
| 7,741,929 B2 | 6/2010 | Hash |
| 7,821,355 B2 | 10/2010 | Engel |

(Continued)

OTHER PUBLICATIONS

Andrews, David, "Chapter 4: Passive Synthesis," Lumped Element Quadrature Hybrids, Copyright: 2006, pp. 79-81, Artech House, Inc., Norwood, Massachusetts.

(Continued)

*Primary Examiner* — Dean O Takaoka
(74) *Attorney, Agent, or Firm* — Withrow & Terranova, P.L.L.C.

(57) ABSTRACT

A diplexer circuit is provided. The diplexer circuit, which includes a pair of hybrid couplers and a filter circuit, can be configured to support dual-connect (DC) communications on a pair of signal bands separated by a narrower transition band (e.g., ≤200 MHz). In examples discussed herein, one of the signal bands is associated with a narrower fractional bandwidth (e.g., <13%) than the other signal band. In this regard, the filter circuit can be opportunistically configured to operate based on the narrower fractional bandwidth. By configuring the filter circuit to operate based on the narrower fractional bandwidth, it is possible to eliminate the need for supporting the wider fractional bandwidth in the diplexer circuit. As a result, it may be possible to implement the diplexer circuit using conventional filters to support DC communications on signal bands associated with a wider fractional bandwidth(s) and separated by a narrower transition band.

32 Claims, 6 Drawing Sheets

(56) References Cited

U.S. PATENT DOCUMENTS

| | | |
|---|---|---|
| 7,863,998 B2 | 1/2011 | Rofougaran |
| 8,243,855 B2 | 8/2012 | Zarei |
| 8,718,582 B2 | 5/2014 | See et al. |
| 9,042,275 B2 | 5/2015 | Bauder et al. |
| 9,048,805 B2 | 6/2015 | Granger-Jones et al. |
| 9,071,430 B2 | 6/2015 | Bauder et al. |
| 9,083,518 B2 | 7/2015 | Bauder et al. |
| 9,190,979 B2 | 11/2015 | Granger-Jones et al. |
| 9,837,984 B2 | 12/2017 | Khlat et al. |
| 10,476,530 B2 * | 11/2019 | Mandegaran ............ H04B 1/52 |
| 2002/0136193 A1 | 9/2002 | Chang et al. |
| 2004/0008082 A1 | 1/2004 | Dow |
| 2004/0127172 A1 | 7/2004 | Gierkink et al. |
| 2006/0071714 A1 | 4/2006 | Ramaswamy et al. |
| 2007/0207748 A1 | 9/2007 | Toncich |
| 2008/0219389 A1 | 9/2008 | Nisbet |
| 2008/0290947 A1 | 11/2008 | Dawe |
| 2009/0221259 A1 | 9/2009 | Shiramizu et al. |
| 2009/0251618 A1 | 10/2009 | Gao et al. |
| 2009/0279642 A1 | 11/2009 | Zarei |
| 2011/0008042 A1 | 1/2011 | Stewart |
| 2011/0043270 A1 | 2/2011 | Kusuda |
| 2012/0119842 A1 | 5/2012 | Gu et al. |
| 2012/0235735 A1 | 9/2012 | Spits et al. |
| 2013/0028360 A1 | 1/2013 | Rofougaran et al. |
| 2013/0083703 A1 | 4/2013 | Granger-Jones et al. |
| 2013/0115998 A1 | 5/2013 | Lamm et al. |
| 2013/0165067 A1 | 6/2013 | DeVries et al. |
| 2013/0201880 A1 | 8/2013 | Bauder et al. |
| 2013/0201881 A1 | 8/2013 | Bauder et al. |
| 2013/0201882 A1 | 8/2013 | Bauder et al. |
| 2013/0273860 A1 | 10/2013 | Pehlke |
| 2013/0285763 A1 | 10/2013 | Granger-Jones et al. |
| 2014/0192727 A1 | 7/2014 | Liu et al. |
| 2014/0288723 A1 | 9/2014 | Persson |
| 2015/0117281 A1 * | 4/2015 | Khlat ............... H03H 7/463 370/297 |
| 2016/0112072 A1 * | 4/2016 | Bauder ............. H04B 1/0057 370/297 |
| 2016/0191014 A1 | 6/2016 | Khlat et al. |
| 2017/0301992 A1 | 10/2017 | Khlat et al. |
| 2018/0076793 A1 | 3/2018 | Khlat et al. |

OTHER PUBLICATIONS

Andrews, David, "Chapter 5: Practical Design," Lumped Element Quadrature Hybrids, Copyright: 2006, pp. 129-135, Artech House, Inc., Norwood, Massachusetts.

Fisher, R.E., "Broad-Band Twisted-Wire Quadrature Hybrids," IEEE Transactions on Microwave Theory and Techniques, vol. 21, Issue 5, May 1973, pp. 355-357.

Monteath, G.D., "Coupled Transmission Lines as Symmetrical Directional Couplers," Proceedings of the IEE—Part B: Radio and Electronic Engineering, vol. 102, Issue 3, May 1955, pp. 383-392.

Rizzi, Peter A., "Chapter 9: Some Filter and Resonator Applications," Microwave Engineering: Passive Circuits, Copyright: 1988, pp. 504-507, Prentice Hall, Englewood Cliffs, New Jersey.

Vizmuller, Peter, "Chapter 2: Circuit Examples," RF Design Guide: Systems, Circuits, and Equations, Copyright: 1995, Artech House, Inc., Norwood, Massachusetts, pp. 95-108.

Wen, Jiguo et al., "Suppression of Reflection Coefficients of Surface Acoustic Wave Filters Using Quadrature Hybrids," IEEE Transactions on Ultrasonics, Ferroelectrics, and Frequency Controls, vol. 53, No. 10, Oct. 2006, pp. 1912-1917.

Young, Leo et al., "A High Power Diplexing Filter," IRE Transactions on Microwave Theory and Techniques, Jul. 1959, pp. 384-387.

Zybura, Mike et al., "Combined Balun Transformer and Harmonic Filter", U.S. Appl. No. 61/555,311, filed Nov. 3, 2011, 9 pages.

Non-Final Office Action for U.S. Appl. No. 13/633,459, dated Jun. 26, 2014, 28 pages.

Final Office Action for U.S. Appl. No. 13/633,459, dated Oct. 17, 2014, 23 pages.

Notice of Allowance for U.S. Appl. No. 13/633,459, dated Jan. 13, 2015, 11 pages.

Non-Final Office Action for U.S. Appl. No. 13/760,159, dated Aug. 14, 2014, 10 pages.

Notice of Allowance for U.S. Appl. No. 13/760,159, dated Jan. 14, 2015, 6 pages.

Non-Final Office Action for U.S. Appl. No. 13/925,891, dated Jan. 16, 2015, 10 pages.

Notice of Allowance for U.S. Appl. No. 13/925,891, dated Jul. 1, 2015, 7 pages.

Non-Final Office Action for U.S. Appl. No. 13/760,201, dated Aug. 28, 2014, 9 pages.

Notice of Allowance for U.S. Appl. No. 13/760,201, dated Feb. 27, 2015, 8 pages.

Non-Final Office Action for U.S. Appl. No. 13/760,240, dated Aug. 27, 2014, 13 pages.

Notice of Allowance for U.S. Appl. No. 13/760,240, dated Mar. 4, 2015, 8 pages.

\* cited by examiner

DIPLEXER CIRCUIT

RELATED APPLICATIONS

This application claims the benefit of provisional patent application Ser. No. 62/661,452, filed Apr. 23, 2018, the disclosure of which is hereby incorporated herein by reference in its entirety.

FIELD OF THE DISCLOSURE

The technology of the disclosure relates generally to a diplexer circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A mobile communication device may operate in a dual connect (DC) mode, in which the mobile communication device is configured to transmit/receive two signals simultaneously in a pair of transmit/receive bands. In a non-limiting example, the mobile communication device can be configured to operate in the DC mode to transmit/receive two signals in fifth-generation new radio (5G-NR) bands 77 and 79, respectively. The 5G-NR band 77 ranges from 3.3 GHz to 4.2 GHz and the 5G-NR band 79 ranges from 4.4 GHz to 5.0 GHz. A narrow transition band ranging from 4.2 GHz to 4.4 GHz separates the 5G-NR band 77 and the 5G-NR band 79.

Fractional bandwidth, which is often quoted as a percentage, is a commonly used measure for comparing bandwidths between signals. The fraction bandwidth, which may be expressed by a percentage, is defined as $(f_2-f_1)/f_c$, wherein $f_1$, $f_2$, and $f_c$ represent lower frequency, upper frequency, and center frequency of a signal, respectively. Accordingly, the fractional bandwidths of the 5G-NR band 77 and the 5G-NR band 79 can be 24% and 12.9% respectively. In this regard, the 5G-NR band 77 has a wider bandwidth than the 5G-NR band 79.

The mobile communication device may be configured to transmit/receive the two signals in the 5G-NR bands 77 and 79 via a common antenna port. In this regard, a diplexer circuit(s) is often required to separate the two signals presented at the common antenna and to route the separated signals to appropriate receivers. A conventional low-temperature-cofired-ceramic (LTCC) diplexer can function well with very wide fractional bandwidth, but requires a wider transition band. In contrast, an acoustic diplexer can function well with a narrower transition band, but has problems handling wider fractional bandwidth. In this regard, it may be desirable to have a diplexer circuit that can function with wider fractional bandwidth and a narrower transition band.

SUMMARY

Embodiments of the disclosure relate to a diplexer circuit. The diplexer circuit, which includes a pair of hybrid couplers and a filter circuit, can be configured to support dual-connect (DC) communications on a pair of signal bands separated by a narrower transition band (e.g., ≤200 MHz). In examples discussed herein, one of the signal bands is associated with a narrower fractional bandwidth (e.g., <13%) than the other signal band. In this regard, the filter circuit can be opportunistically configured to operate based on the narrower fractional bandwidth. By configuring the filter circuit to operate based on the narrower fractional bandwidth, it is possible to eliminate the need for supporting the wider fractional bandwidth in the diplexer circuit. As a result, it may be possible to implement the diplexer circuit using conventional filters (e.g., acoustic filter, ladder filter, etc.) to support DC communications on signal bands associated with a wider fractional bandwidth(s) and separated by a narrower transition band.

In one aspect, a diplexer circuit is provided. The diplexer circuit includes a first hybrid coupler comprising a first input port, a first isolated port, a first in-phase port, and a first quadrature port. The first hybrid coupler is configured to receive and split a selected first transmit signal among a first transmit signal in a first transmit band and a second transmit signal in a second transmit band into a first in-phase transmit signal and a first quadrature transmit signal. The diplexer circuit also includes a second hybrid coupler comprising a second input port, a second isolated port, a second in-phase port, and a second quadrature port. The second hybrid coupler configured to receive and split a selected second transmit signal among the first transmit signal and the second transmit signal into a second in-phase transmit signal and a second quadrature transmit signal. The diplexer circuit also includes a filter circuit coupled between the first hybrid coupler and the second hybrid coupler. The filter circuit is configured to pass the second in-phase transmit signal and the second quadrature transmit signal to the first hybrid coupler. The filter circuit is also configured to reflect the first in-phase transmit signal and the first quadrature transmit signal to the first hybrid coupler. The first hybrid coupler is further configured to output a transmit signal comprising the first transmit signal in the first transmit band and the second transmit signal in the second transmit band based on the first in-phase transmit signal, the first quadrature transmit signal, the second in-phase transmit signal, and the second quadrature transmit signal.

In another aspect, an apparatus is provided. The apparatus includes a transceiver circuit configured to generate a first transmit signal in a first transmit band and a second transmit signal in a second transmit band. The apparatus also includes a diplexer circuit. The diplexer circuit includes a first hybrid coupler comprising a first input port, a first isolated port, a first in-phase port, and a first quadrature port. The first hybrid coupler is configured to receive and split a selected first transmit signal among the first transmit signal and the second transmit signal into a first in-phase transmit signal and a first quadrature transmit signal. The diplexer circuit also includes a second hybrid coupler comprising a second input port, a second isolated port, a second in-phase port, and a second quadrature port. The second hybrid coupler is configured to receive and split a selected second transmit signal among the first transmit signal and the second transmit signal into a second in-phase transmit signal and a second quadrature transmit signal. The diplexer circuit also includes a filter circuit coupled between the first hybrid coupler and the second hybrid coupler. The filter circuit is configured to pass the second in-phase transmit signal and the second quadrature transmit signal to the first hybrid coupler. The filter circuit is also configured to reflect the first in-phase transmit signal and the first quadrature transmit signal to the first hybrid coupler. The first hybrid coupler is further configured to output a transmit signal comprising the first transmit signal in the first transmit band and the second transmit signal in the second transmit band based on the first in-phase transmit signal, the first quadrature transmit signal, the second in-phase transmit signal, and the second quadrature transmit signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3A:
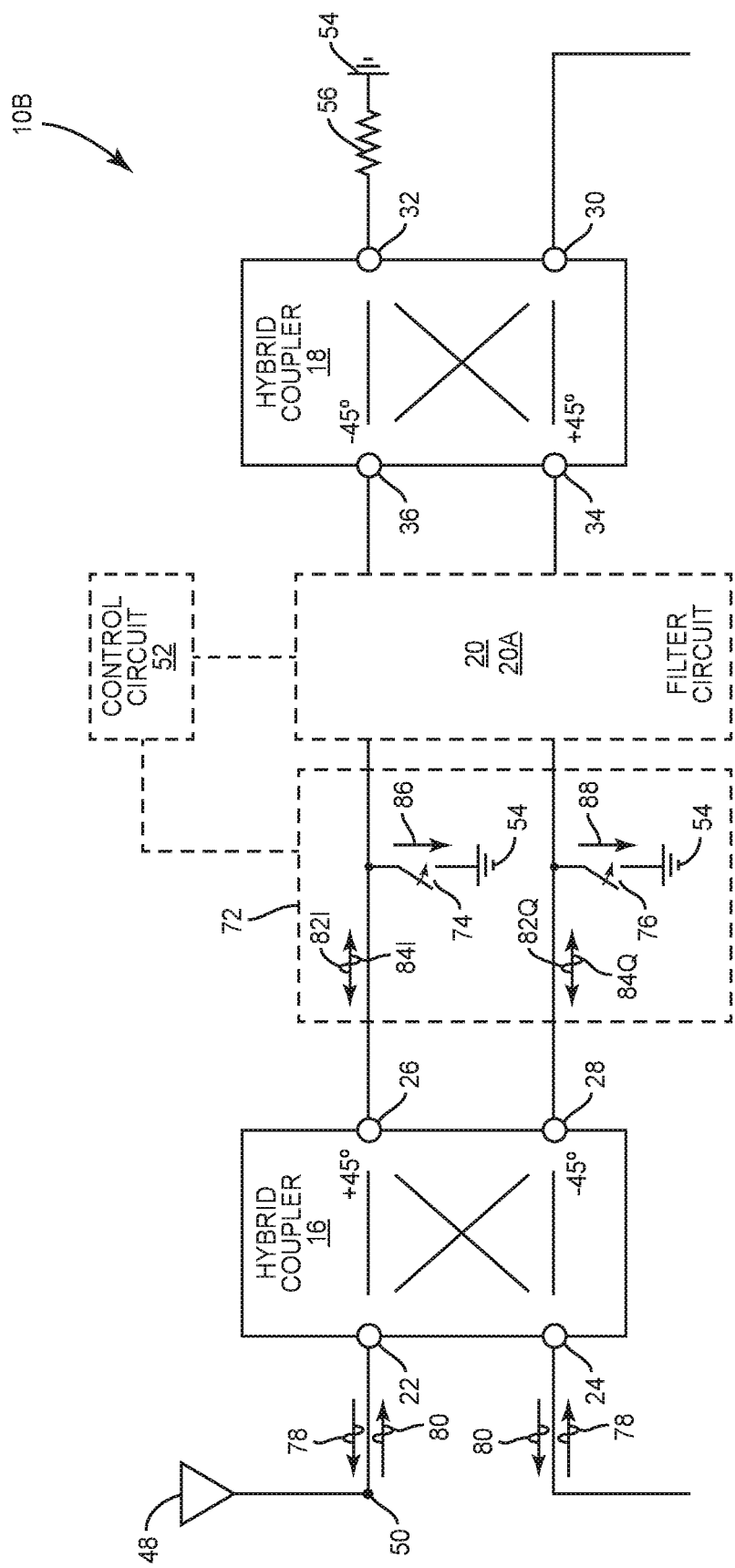
Figure 3B:
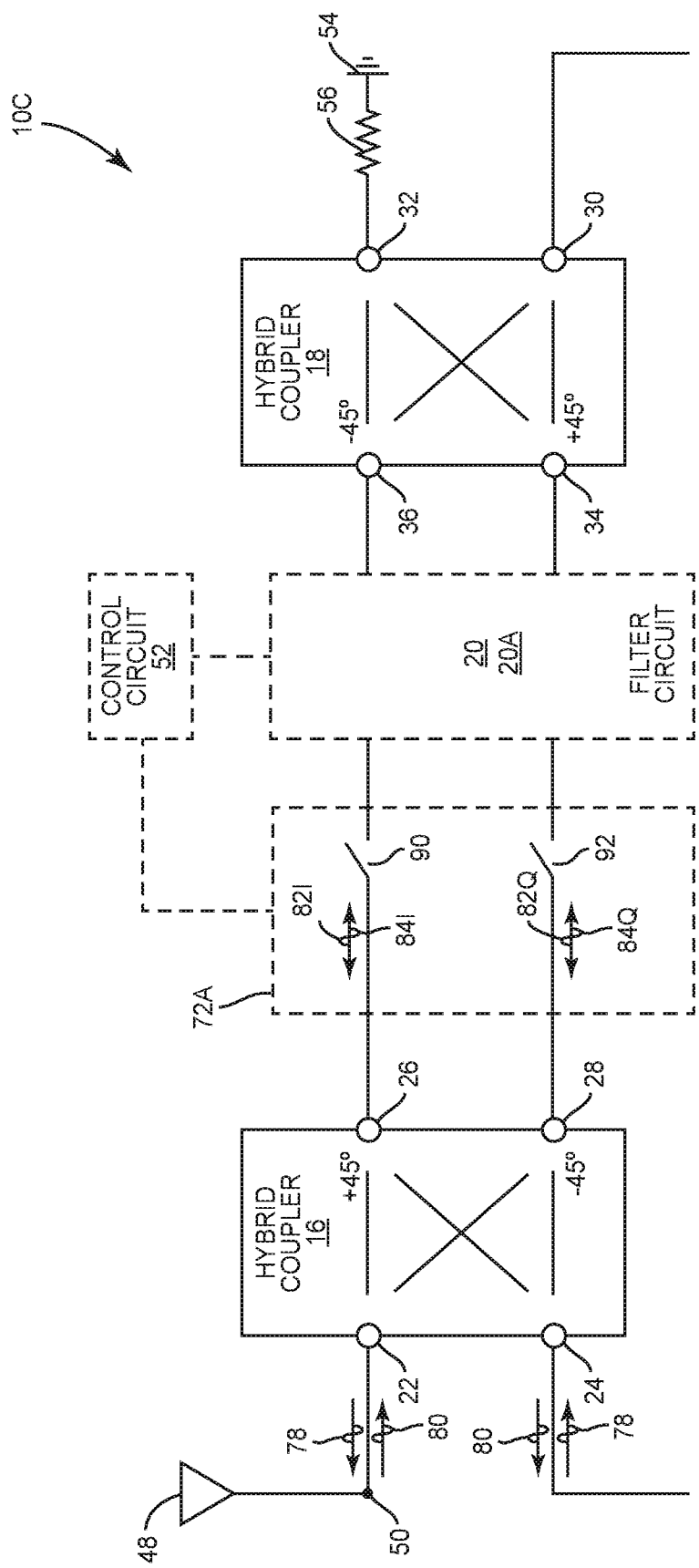

FIG. 3A is a schematic diagram of an exemplary diplexer circuit configured according to one embodiment of the present disclosure to help reduce insertion loss and/or power reflection when only one transmit/receive signal is communicated; and FIG. 3B is a schematic diagram of an exemplary diplexer circuit configured according to another embodiment of the present disclosure to help reduce insertion loss and/or power reflection when only one transmit/receive signal is communicated.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a diplexer circuit. The diplexer circuit, which includes a pair of hybrid couplers and a filter circuit, can be configured to support dual-connect (DC) communications on a pair of signal bands separated by a narrower transition band (e.g., ≤200 MHz). In examples discussed herein, one of the signal bands is associated with a narrower fractional bandwidth (e.g., <13%) than the other signal band. In this regard, the filter circuit can be opportunistically configured to operate based on the narrower fractional bandwidth. By configuring the filter circuit to operate based on the narrower fractional bandwidth, it is possible to eliminate the need for supporting the wider fractional bandwidth in the diplexer circuit. As a result, it may be possible to implement the diplexer circuit using conventional filters (e.g., acoustic filter, ladder filter, etc.) to support DC communications on signal bands associated with a wider fractional bandwidth(s) and separated by a narrower transition band.

Figure 1A:
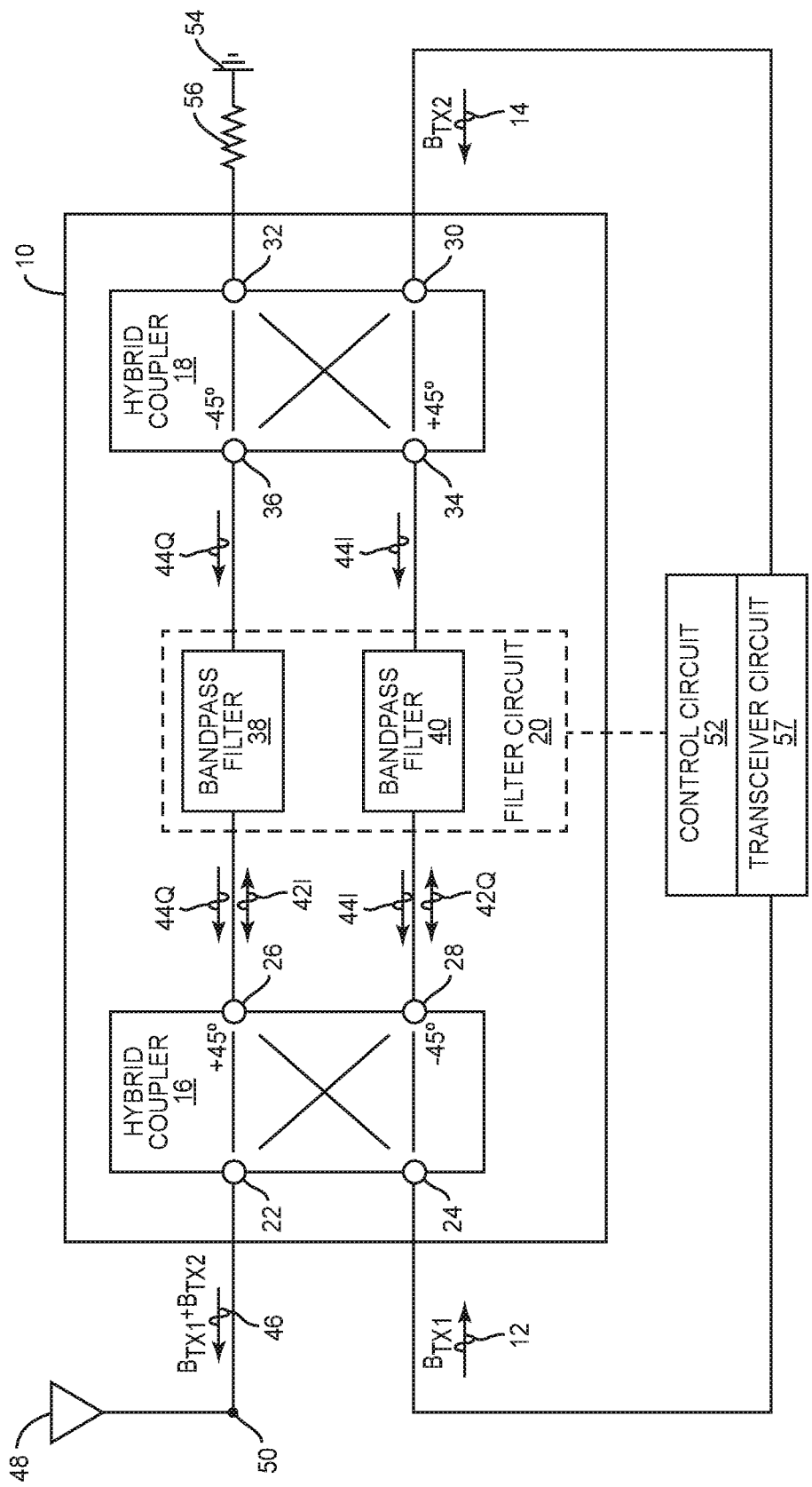
FIG. 1A is a schematic diagram of an exemplary diplexer circuit configured according to one embodiment of the present disclosure to transmit concurrently a first transmit signal and a second transmit signal in a first transmit band and a second transmit band, respectively.

In this regard, FIG. 1A is a schematic diagram of an exemplary diplexer circuit 10 configured according to one embodiment of the present disclosure to transmit concurrently a first transmit signal 12 and a second transmit signal 14 in a first transmit band $B_{TX1}$ and a second transmit band $B_{TX2}$, respectively. The diplexer circuit 10 includes a first hybrid coupler 16, a second hybrid coupler 18, and a filter circuit 20 coupled between the first hybrid coupler 16 and the second hybrid coupler 18.

The first transmit band $B_{TX1}$ may have a wider fractional bandwidth than the second transmit band $B_{TX2}$. In a non-limiting example, the first transmit band $B_{TX1}$ is fifth-generation new radio (5G-NR) band 77, which ranges from 3.3 GHz to 4.2 GHz and has a wider fractional bandwidth at 24%, and the second transmit band $B_{TX2}$ is 5G-NR band 79, which ranges from 4.4 GHz to 5.0 GHz and has a narrower fractional bandwidth at 12.9%. As discussed in detail below, the filter circuit 20 can be opportunistically configured to operate based on the narrower fractional bandwidth (12.9%) associated with the second transmit band $B_{TX2}$, thus eliminating a requirement for supporting the wider fractional bandwidth (24%) associated with the first transmit band $B_{TX1}$. As a result, it may be possible to implement the diplexer circuit 10 using conventional filters (e.g., acoustic filter, ladder filter, etc.) to support DC communications on signal bands associated with a wider fractional bandwidth(s) and separated by a narrower transition band.

The first hybrid coupler 16 includes a first input port 22, a first isolated port 24, a first in-phase port 26, and a first quadrature port 28. The second hybrid coupler 18 includes a second input port 30, a second isolated port 32, a second in-phase port 34, and a second quadrature port 36. In a non-limiting example, both the first hybrid coupler 16 and the second hybrid coupler 18 are quadrature couplers. In this regard, each of the first hybrid coupler 16 and the second hybrid coupler 18 can generate a respective in-phase signal having a reference phase and a respective quadrature signal having approximately 90° offset to the reference phase of the respective in-phase signal. For example, the reference phase of the respective in-phase signal can be 0° and the phase of the respective quadrature signal may be ±90°. Alternatively, the reference phase of the respective in-phase signal can be +45° or −45° and the phase of the respective quadrature signal may be −45° or +45°. It should be appreciated that each of the first hybrid coupler 16 and the second hybrid coupler 18 can generate the respective in-phase signal and the respective quadrature signal at any phases, so long as a relative phase between the respective in-phase signal and the respective quadrature signal is maintained at approximately ±90°.

The filter circuit 20 includes a first bandpass filter 38 coupled between the first in-phase port 26 and the second quadrature port 36. The filter circuit 20 also includes a second bandpass filter 40 coupled between the first quadrature port 28 and the second in-phase port 34. The first bandpass filter 38 and the second bandpass filter 40 are configured to pass signals communicated in the second transmit band $B_{TX2}$, while rejecting signals communicated in the first transmit band $B_{TX1}$. In a non-limiting example, the first bandpass filter 38 and the second bandpass filter 40 can be acoustic filters as discussed in U.S. Pat. No. 9,837,984 B2. Since the filter circuit 20 is configured to only pass the second transmit signal 14 in the second transmit band $B_{TX2}$, the first bandpass filter 38 and the second bandpass filter 40 can be implemented based on such conventional acoustic filters as bulk-acoustic-wave (BAW) filter or surface-acoustic-wave (SAW) filter.

The first hybrid coupler 16 is configured to receive the first transmit signal 12 (also referred to as "selected first transmit signal" herein) via the first isolated port 24. The first hybrid coupler 16 splits the first transmit signal 12 into a first in-phase signal 42I and a first quadrature signal 42Q. In a non-limiting example, the first in-phase signal 42I has a +45° phase and the first quadrature signal 42Q has a −45° phase. The first hybrid coupler 16 outputs the first in-phase signal 42I and the first quadrature signal 42Q via the first in-phase port 26 and the first quadrature port 28, respectively. Accordingly, the first in-phase signal 42I and the first quadrature signal 42Q propagate from the first in-phase port 26 and the first quadrature port 28 toward the first bandpass filter 38 and the second bandpass filter 40, respectively. Given that the first bandpass filter 38 and the second bandpass filter 40 are configured to only pass signals in the second transmit band $B_{TX2}$, the first in-phase signal 42I and the first quadrature signal 42Q are rejected by the first bandpass filter 38 and the second bandpass filter 40, respectively. As a result, the first in-phase signal 42I and the first quadrature signal 42Q are reflected back toward the first in-phase port 26 and the first quadrature port 28, respectively.

The second hybrid coupler 18 is configured to receive the second transmit signal 14 (also referred to as "selected second transmit signal" herein) via the second input port 30. The second hybrid coupler 18 splits the second transmit signal 14 into a second in-phase signal 44I and a second quadrature signal 44Q. In a non-limiting example, the second in-phase signal 44I has a +45° phase and the second quadrature signal 44Q has a −45° phase. The second hybrid coupler 18 outputs the second in-phase signal 44I and the second quadrature signal 44Q via the second in-phase port 34 and the second quadrature port 36, respectively. Accordingly, the second in-phase signal 44I and the second quadrature signal 44Q propagate from the second in-phase port 34 and the second quadrature port 36 toward the second bandpass filter 40 and the first bandpass filter 38, respectively. Given that the first bandpass filter 38 and the second bandpass filter 40 are configured to only pass signals in the second transmit band $B_{TX2}$, the second in-phase signal 44I and the second quadrature signal 44Q are passed by the second bandpass filter 40 and the first bandpass filter 38, respectively. As a result, the second in-phase signal 44I and the second quadrature signal 44Q propagate toward the first quadrature port 28 and the first in-phase port 26, respectively.

The first hybrid coupler 16 is further configured to generate a transmit signal 46 based on the first in-phase signal 42I, the first quadrature signal 42Q, the second in-phase signal 44I, and the second quadrature signal 44Q. In this regard, the transmit signal 46 may be a combined signal, which includes the first transmit signal 12 in the first transmit band $B_{TX1}$ and the second transmit signal 14 in the second transmit band $B_{TX2}$. The first hybrid coupler 16 outputs the transmit signal 46 via the first input port 22. In a non-limiting example, the first input port 22 can be coupled to an antenna 48 via an antenna port 50. As such, the diplexer circuit 10 can support DC communication by transmitting the first transmit signal 12 and the second transmit signal 14 concurrently in first transmit band $B_{TX1}$ and the second transmit band $B_{TX2}$, respectively.

The diplexer circuit 10 may include or be coupled to a control circuit 52, which can be a field-programmable gate array (FPGA) for example. The control circuit 52 can be configured to tune the first bandpass filter 38 and/or the second bandpass filter 40 to an appropriate passband associated with the second transmit signal 14. The second isolated port 32 may be coupled to a ground 54 via a resistor(s) 56.

The first isolated port 24 and the second input port 30 may be coupled to a transceiver circuit 57. In a non-limiting example, the transceiver circuit 57 is configured to generate and provide the first transmit signal 12 and the second transmit signal 14 to the first isolated port 24 and the second input port 30, respectively.

Figure 1B:
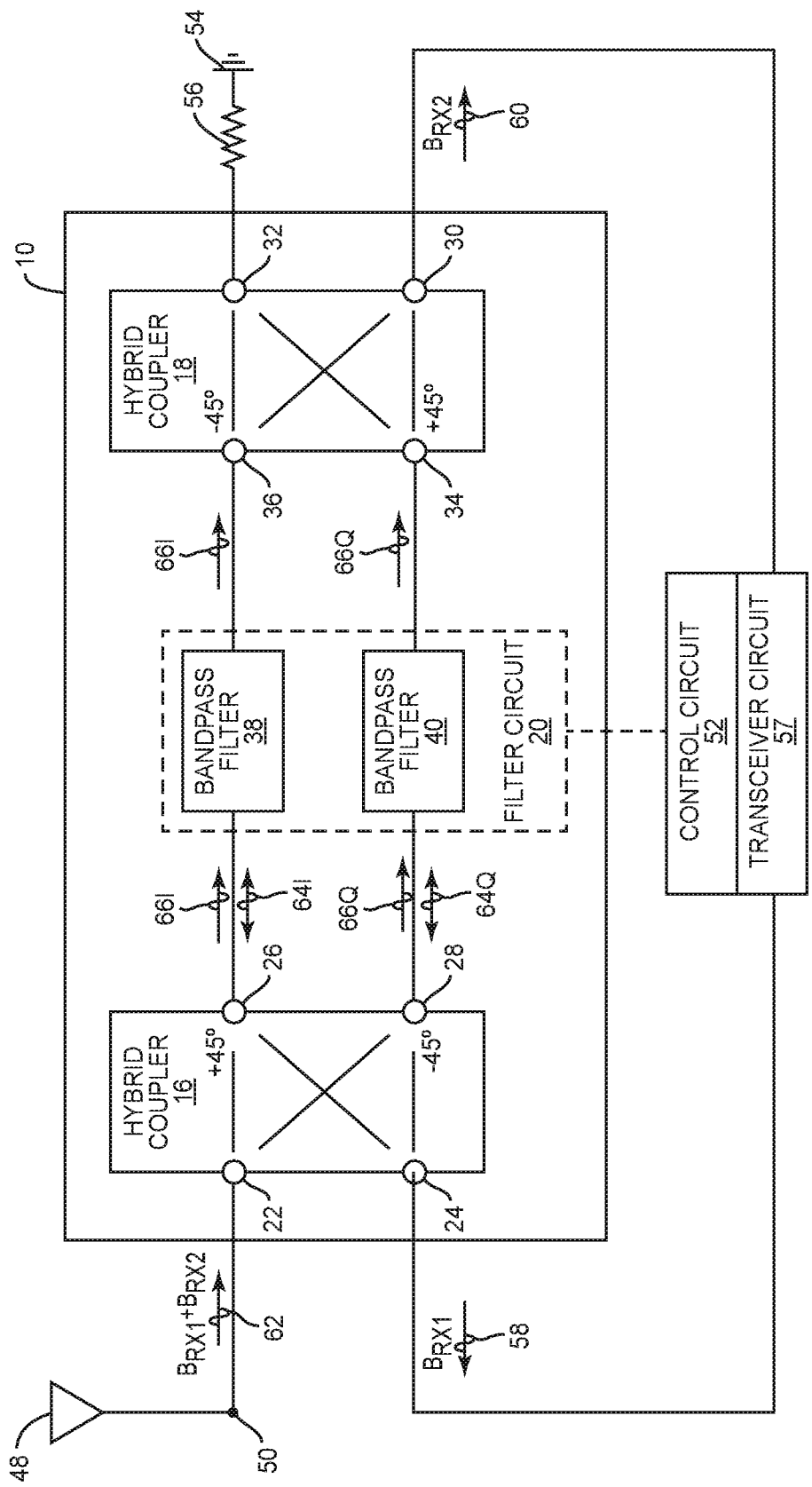
FIG. 1B is a schematic diagram of the diplexer circuit of FIG. 1A configured to receive concurrently a first receive signal and a second receive signal in a first receive band and a second receive band, respectively.

FIG. 1B is a schematic diagram of the diplexer circuit 10 of FIG. 1A configured to receive concurrently a first receive signal 58 (also referred to as "selected first receive signal" herein) and a second receive signal 60 (also referred to as "selected second receive signal" herein) in a first receive band $B_{RX1}$ and a second receive band $B_{RX2}$, respectively. Common elements between FIGS. 1A and 1B are shown therein with common element numbers and will not be re-described herein.

The first hybrid coupler 16 is further configured to receive a receive signal 62 via the first input port 22. The receive signal 62 may be a combined signal that includes the first receive signal 58 in the first receive band $B_{RX1}$ and the second receive signal 60 in the second receive band $B_{RX2}$. The first hybrid coupler 16 is configured to split the first receive signal 58 into a first in-phase receive signal 64I and a first quadrature receive signal 64Q for output via the first in-phase port 26 and the first quadrature port 28, respectively. Accordingly, the first in-phase receive signal 64I and the first quadrature receive signal 64Q propagate from the first in-phase port 26 and the first quadrature port 28 toward the first bandpass filter 38 and the second bandpass filter 40, respectively. The first hybrid coupler 16 is also configured to split the second receive signal 60 into a second in-phase receive signal 66I and a second quadrature receive signal 66Q for output via the first in-phase port 26 and the first quadrature port 28, respectively. Accordingly, the second in-phase receive signal 66I and the second quadrature receive signal 66Q propagate from the first in-phase port 26 and the first quadrature port 28 toward the first bandpass filter 38 and the second bandpass filter 40, respectively.

The first bandpass filter 38 and the second bandpass filter 40 are tuned by the control circuit 52 to pass signals in the passband of the second receive band $B_{RX2}$ and reject signals outside the passband of the second receive band $B_{RX2}$. As such, the first bandpass filter 38 and the second bandpass filter 40 reject the first in-phase receive signal 64I (also referred to as "selected first in-phase receive signal") and the first quadrature receive signal 64Q (also referred to as "selected first quadrature receive signal"), respectively. Accordingly, the first in-phase receive signal 64I and the first quadrature receive signal 64Q are reflected back toward the first in-phase port 26 and the first quadrature port 28, respectively. As such, the first hybrid coupler 16 is configured to recombine the first in-phase receive signal 64I and the first quadrature receive signal 64Q into the first receive signal 58 and output the first receive signal 58 to the transceiver circuit 57 via the first isolated port 24.

In contrast, the first bandpass filter 38 and the second bandpass filter 40 pass the second in-phase receive signal 66I (also referred to as "selected second in-phase signal") and the second quadrature receive signal 66Q (also referred to as "selected second quadrature receive signal") toward the second quadrature port 36 and the second in-phase port 34, respectively. Accordingly, the second hybrid coupler 18 is configured to combine the second in-phase receive signal 66I and the second quadrature receive signal 66Q into the second receive signal 60 and output the second receive signal 60 to the transceiver circuit 57 via the second input port 30.

Figure 2A:
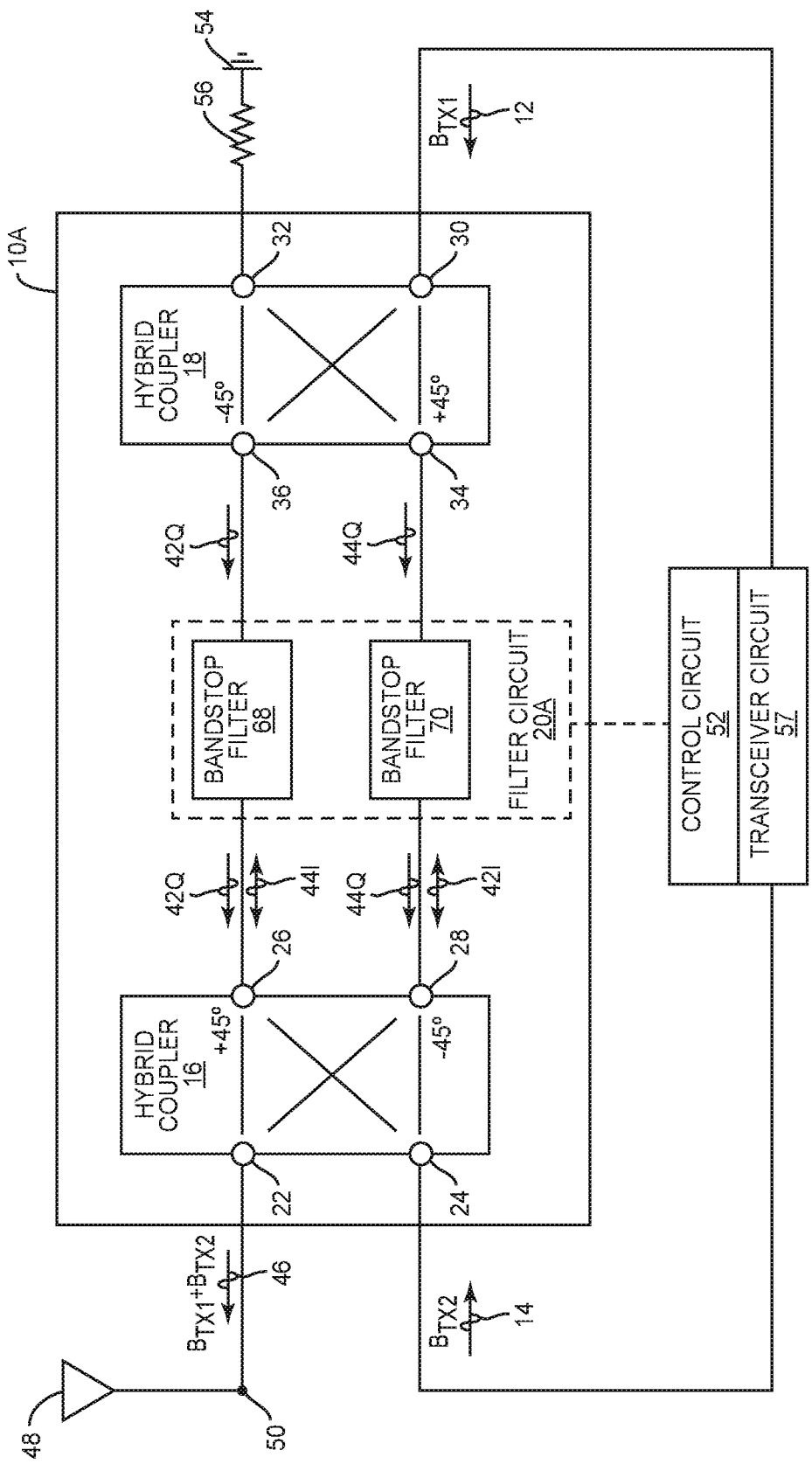
FIG. 2A is a schematic diagram of an exemplary diplexer circuit configured according to another embodiment of the present disclosure to transmit concurrently the first transmit signal and the second transmit signal of FIG. 1A in the first transmit band and the second transmit band, respectively.

The first bandpass filter 38 and the second bandpass filter 40 can be replaced by bandstop filters, as discussed next in reference to FIGS. 2A and 2B. In this regard, FIG. 2A is a schematic diagram of an exemplary diplexer circuit 10A configured according to another embodiment of the present disclosure to transmit concurrently the first transmit signal 12 and the second transmit signal 14 of FIG. 1A in the first transmit band $B_{TX1}$ and the second transmit band $B_{TX2}$, respectively. Common elements between FIGS. 1A and 2A are shown therein with common element numbers and will not be re-described herein.

The diplexer circuit 10A includes a filter circuit 20A. The filter circuit 20A includes a first bandstop filter 68 coupled between the first in-phase port 26 and the second quadrature port 36. The filter circuit 20A also includes a second bandstop filter 70 coupled between the first quadrature port 28 and the second in-phase port 34. The first bandstop filter 68 and the second bandstop filter 70 are configured to stop signals communicated in the second transmit band $B_{TX2}$, while passing signals communicated in the first transmit band $B_{TX1}$. In a non-limiting example, the first bandstop filter 68 and the second bandstop filter 70 can be acoustic filters as discussed in U.S. Pat. No. 9,837,984 B2. Since the filter circuit 20A is configured to only stop the second transmit signal 14 in the second transmit band $B_{RX2}$, the first bandstop filter 68 and the second bandstop filter 70 can be implemented based on such conventional acoustic filters as BAW filters or SAW filters.

The first hybrid coupler 16 is configured to receive the second transmit signal 14 (also referred to as "selected first transmit signal" herein) from the transceiver circuit 57 via the first isolated port 24. The first hybrid coupler 16 splits the second transmit signal 14 into the second in-phase signal 44I and the second quadrature signal 44Q. In a non-limiting example, the second in-phase signal 44I has a +45° phase and the second quadrature signal 44Q has a −45° phase. The first hybrid coupler 16 outputs the second in-phase signal 44I and the second quadrature signal 44Q via the first in-phase port 26 and the first quadrature port 28, respectively. Accordingly, the second in-phase signal 44I and the second quadrature signal 44Q propagate from the first in-phase port 26 and the first quadrature port 28 toward the first bandstop filter 68 and the second bandstop filter 70, respectively. Given that the first bandstop filter 68 and the second bandstop filter 70 are configured to only reject signals in the second transmit band $B_{RX2}$, the second in-phase signal 44I and the second quadrature signal 44Q are rejected by the first bandstop filter 68 and the second bandstop filter 70, respectively. As a result, the second in-phase signal 44I and the second quadrature signal 44Q are reflected back toward the first in-phase port 26 and the first quadrature port 28, respectively.

The second hybrid coupler 18 is configured to receive the first transmit signal 12 (also referred to as "selected second transmit signal" herein) from the transceiver circuit 57 via the second input port 30. The second hybrid coupler 18 splits the first transmit signal 12 into the first in-phase signal 42I and the first quadrature signal 42Q. In a non-limiting example, the first in-phase signal 42I has a +45° phase and the first quadrature signal 42Q has a −45° phase. The second hybrid coupler 18 outputs the first in-phase signal 42I and the first quadrature signal 42Q via the second in-phase port 34 and the second quadrature port 36, respectively. Accordingly, the first in-phase signal 42I and the first quadrature signal 42Q propagate from the second in-phase port 34 and the second quadrature port 36 toward the second bandstop filter 70 and the first bandstop filter 68, respectively. Given that the first bandstop filter 68 and the second bandstop filter 70 are configured to only reject signals in the second transmit band $B_{TX2}$, the first in-phase signal 42I and the first quadrature signal 42Q are passed by the second bandstop filter 70 and the first bandstop filter 68, respectively. As a result, the first in-phase signal 42I and the first quadrature signal 42Q propagate toward the first quadrature port 28 and the first in-phase port 26, respectively.

The first hybrid coupler 16 is further configured to generate the transmit signal 46 based on the first in-phase signal 42I, the first quadrature signal 42Q, the second in-phase signal 44I, and the second quadrature signal 44Q. In this regard, the transmit signal 46 may be a combined signal, which includes the first transmit signal 12 in the first transmit band $B_{TX1}$ and the second transmit signal 14 in the second transmit band $B_{TX2}$. The first hybrid coupler 16 outputs the transmit signal 46 via the first input port 22.

Figure 2B:
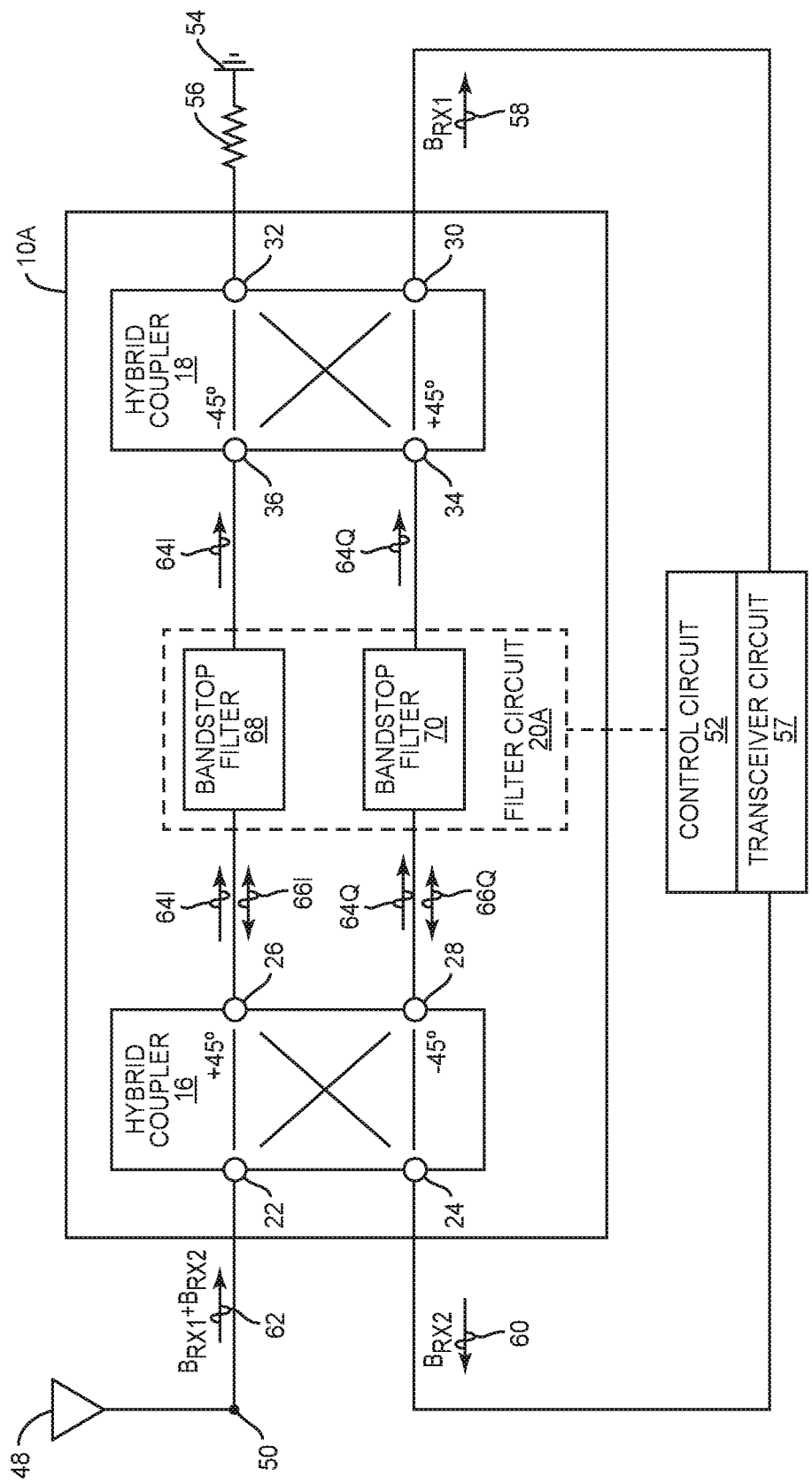
FIG. 2B is a schematic diagram of the diplexer circuit of FIG. 2A configured to receive concurrently the first receive signal and the second receive signal in the first receive band and the second receive band, respectively.

FIG. 2B is a schematic diagram of the diplexer circuit 10A of FIG. 2A configured to receive concurrently the first receive signal 58 (also referred to as "selected second receive signal" herein) and the second receive signal 60 (also referred to as "selected first receive signal" herein) in the first receive band $B_{RX1}$ and the second receive band $B_{RX2}$, respectively. Common elements between FIGS. 1B, 2A, and 2B are shown therein with common element numbers and will not be re-described herein.

The first hybrid coupler 16 is further configured to receive the receive signal 62 via the first input port 22. The receive signal 62 includes the first receive signal 58 in the first receive band $B_{RX1}$ and the second receive signal 60 in the second receive band $B_{RX2}$. The first hybrid coupler 16 is configured to split the first receive signal 58 into a first in-phase receive signal 64I and a first quadrature receive signal 64Q for output via the first in-phase port 26 and the first quadrature port 28, respectively. Accordingly, the first in-phase receive signal 64I and the first quadrature receive signal 64Q propagate from the first in-phase port 26 and the first quadrature port 28 toward the first bandstop filter 68 and the second bandstop filter 70, respectively. The first hybrid coupler 16 is also configured to split the second receive signal 60 into the second in-phase receive signal 66I and the second quadrature receive signal 66Q for output via the first in-phase port 26 and the first quadrature port 28, respectively. Accordingly, the second in-phase receive signal 66I and the second quadrature receive signal 66Q propagate from the first in-phase port 26 and the first quadrature port 28 toward the first bandstop filter 68 and the second bandstop filter 70, respectively.

The first bandstop filter 68 and the second bandstop filter 70 are tuned by the control circuit 52 to pass signals in the passband of the first receive band $B_{RX1}$ and reject signals outside the passband of the first receive band $B_{RX1}$. As such, the first bandstop filter 68 and the second bandstop filter 70 reject the second in-phase receive signal 66I (also referred to as "selected first in-phase receive signal") and the second quadrature receive signal 66Q (also referred to as "selected first quadrature receive signal"), respectively. Accordingly, the second in-phase receive signal 66I and the second quadrature signal receive 66Q are reflected back toward the first in-phase port 26 and the first quadrature port 28, respectively. As such, the first hybrid coupler 16 is configured to recombine the second in-phase receive signal 66I and the second quadrature receive signal 66Q into the second receive signal 60 and output the second receive signal 60 to the transceiver circuit 57 via the first isolated port 24.

In contrast, the first bandstop filter 68 and the second bandstop filter 70 pass the first in-phase receive signal 64I (also referred to as "selected second in-phase receive signal") and the first quadrature receive signal 64Q (also referred to as "selected second quadrature receive signal") toward the second quadrature port 36 and the second in-phase port 34, respectively. Accordingly, the second hybrid coupler 18 is configured to combine the first in-phase receive signal 64I and the first quadrature receive signal 64Q into the first receive signal 58 and output the first receive signal 58 to the transceiver circuit 57 via the second input port 30.

In a non-limiting example, the diplexer circuit 10 of FIGS. 1A and 1B and the diplexer circuit 10A of FIGS. 2A and 2B can be configured for transmitting a selected transmit signal (e.g., the first transmit signal 12) among the first transmit signal 12 and the second transmit signal 14 and for receiving a selected receive signal (e.g., the first receive signal 58) among the first receive signal 58 and the second receive signal 60. In this regard, it may be desirable to bypass the filter circuit 20 or the filter circuit 20A to help reduce insertion loss and power reflection.

In this regard, FIG. 3A is a schematic diagram of an exemplary diplexer circuit 10B configured according to one embodiment of the present disclosure to help reduce insertion loss and/or power reflection when only one transmit/receive signal is communicated. Common elements between FIGS. 1A, 1B, 2A, 2B, and 3A are shown therein with common element numbers and will not be re-described herein.

The diplexer circuit 10B includes a switching circuit 72, which may be controlled by the control circuit 52. The switching circuit 72 includes a first shunt switch 74 and a second shunt switch 76. The first shunt switch 74 and the second shunt switch 76 may be silicon-on-insulator (SOI) switches or microelectromechanical (MEM) switches. Although the switching circuit 72, as illustrated in FIG. 3A, consists of only the first shunt switch 74 and the second shunt switch 76, it should be appreciated that the switching circuit 72 may be provided based on any number and type of switches configured according to any suitable layout. The diplexer circuit 10B is configured for transmitting a selected transmit signal 78 and for receiving a selected receive signal 80. The selected transmit signal 78 can be any one of the first transmit signal 12 and the second transmit signal 14. The selected transmit signal 80 can be any one of the first receive signal 58 and the second receive signal 60. In a non-limiting example, the selected transmit signal 78 and the selected receive signal 80 discussed herein refer to the first transmit signal 12 in the first transmit band $B_{TX1}$ and the first receive signal 58 in the first receive band $B_{RX1}$, respectively.

The first hybrid coupler 16 receives the selected transmit signal 78 via the first isolated port 24 and splits the selected transmit signal 78 into an in-phase transmit signal 82I and a quadrature transmit signal 82Q. The in-phase transmit signal 82I and the quadrature transmit signal 82Q, which are outputted from the first in-phase port 26 and the first quadrature port 28, respectively, are reflected back to the first in-phase port 26 and the first quadrature port 28. The first hybrid coupler 16 combines the reflected in-phase transmit signal 82I and the reflected quadrature transmit signal 82Q into the selected transmit signal 78 and outputs the selected transmit signal 78 via the first input port 22.

The first hybrid coupler 16 receives the selected receive signal 80 via the first input port 22 and split the selected receive signal 80 into an in-phase receive signal 84I and a quadrature receive signal 84Q. The in-phase receive signal 84I and the quadrature receive signal 84Q, which are outputted from the first in-phase port 26 and the first quadrature port 28, respectively, are reflected back to the first in-phase port 26 and the first quadrature port 28. The first hybrid coupler 16 combines the reflected in-phase receive signal 84I and the reflected quadrature receive signal 84Q into the selected receive signal 80 and output the selected receive signal 80 via the first isolated port 24.

The control circuit 52 controls the switching circuit 72 to close the first shunt switch 74 and the second shunt switch 76 to form a pair of shunt paths 86 and 88. By closing the first shunt switch 74 and the second shunt switch 76, it may be possible to reduce insertion loss and/or power reflection associated with the filter circuit 20 or the filter circuit 20A as well as the second hybrid coupler 18. As a result, it may be possible to reduce power attenuation of the reflected transmit/receive signals.

FIG. 3B is a schematic diagram of an exemplary diplexer circuit 10C configured according to another embodiment of the present disclosure to help reduce insertion loss and/or power reflection when only one transmit/receive signal is communicated. Common elements between FIGS. 1A, 1B, 2A, 2B, 3A, and 3B are shown therein with common element numbers and will not be re-described herein.

The diplexer circuit 10B includes a switching circuit 72A, which may be controlled by the control circuit 52. The switching circuit 72A includes a first switch 90 and a second switch 92. The first switch 90 and the second switch 92 may be SOI switches or MEM switches. Although the switching circuit 72A, as illustrated in FIG. 3B, consists of only the first switch 90 and the second switch 92, it should be appreciated that the switching circuit 72A may be provided based on any number and type of switches configured according to any suitable layout.

The control circuit 52 may control the switching circuit 72A to open the first switch 90 and the second switch 92 when the diplexer circuit 10C is only transmitting the selected transmit signal 78 and receiving the selected receive signal 80. The control circuit 52 may also control the switching circuit 72A to close the first switch 90 and the second switch 92. As such, the diplexer circuit 10C will function as the diplexer circuit 10 of FIGS. 1A and 1B or the diplexer circuit 10A of the FIGS. 2A and 2B.

Those skilled in the art will recognize improvements and modifications to the preferred embodiments of the present disclosure. All such improvements and modifications are considered within the scope of the concepts disclosed herein and the claims that follow.

What is claimed is:

1. A diplexer circuit comprising:
    a first hybrid coupler comprising a first input port, a first isolated port, a first in-phase port, and a first quadrature port, the first hybrid coupler configured to receive and split a selected first transmit signal among a first transmit signal in a first transmit band and a second transmit signal in a second transmit band into a first in-phase transmit signal and a first quadrature transmit signal each corresponding to a first fractional bandwidth;
    a second hybrid coupler comprising a second input port, a second isolated port, a second in-phase port, and a second quadrature port, the second hybrid coupler configured to receive and split a selected second transmit signal among the first transmit signal and the second transmit signal into a second in-phase transmit signal and a second quadrature transmit signal each corresponding to a second fractional bandwidth smaller than the first fractional bandwidth; and
    a filter circuit coupled between the first hybrid coupler and the second hybrid coupler, the filter circuit configured to:
        pass the second in-phase transmit signal and the second quadrature transmit signal to the first hybrid coupler; and
        reflect the first in-phase transmit signal and the first quadrature transmit signal to the first hybrid coupler;
    wherein the first hybrid coupler is further configured to output a transmit signal comprising the first transmit signal in the first transmit band and the second transmit signal in the second transmit band based on the first in-phase transmit signal, the first quadrature transmit signal, the second in-phase transmit signal, and the second quadrature transmit signal.

2. The diplexer circuit of claim 1 wherein:
    the first hybrid coupler is further configured to:
        receive the selected first transmit signal via the first isolated port;
        output the first in-phase transmit signal and the first quadrature transmit signal via the first in-phase port and the first quadrature port, respectively; and
        output the transmit signal comprising the first transmit signal in the first transmit band and the second transmit signal in the second transmit band via the first input port; and
    the second hybrid coupler is further configured to:
        receive the selected second transmit signal via the second input port; and
        output the second in-phase transmit signal and the second quadrature transmit signal via the second in-phase port and the second quadrature port, respectively.

3. The diplexer circuit of claim 1 wherein:
    the first hybrid coupler is further configured to:
        receive a receive signal comprising a first receive signal in a first receive band and a second receive signal in a second receive band; and
        split the receive signal into a first in-phase receive signal, a first quadrature receive signal, a second in-phase receive signal, and a second quadrature receive signal;
    the filter circuit is further configured to:
        reflect a selected first in-phase receive signal among the first in-phase receive signal and the second in-phase receive signal and a selected first quadrature receive signal among the first quadrature receive signal and the second quadrature receive signal to the first hybrid coupler; and
        pass a selected second in-phase receive signal among the first in-phase receive signal and the second in-phase receive signal and a selected second quadrature receive signal among the first quadrature receive signal and the second quadrature receive signal to the second hybrid coupler; and
    the first hybrid coupler is further configured to output a selected first receive signal based on the selected first in-phase receive signal and the selected first quadrature receive signal; and the second hybrid coupler is further configured to output a selected second receive signal based on the selected second in-phase receive signal and the selected second quadrature receive signal.

4. The diplexer circuit of claim 3 wherein:
the first hybrid coupler is further configured to:
   receive the receive signal comprising the first receive signal in the first receive band and the second receive signal in the second receive band via the first input port;
   output the first in-phase receive signal and the second in-phase receive signal via the first in-phase port;
   output the first quadrature receive signal and the second quadrature receive signal via the first quadrature port; and
   output the selected first receive signal via the first isolated port; and
the second hybrid coupler is further configured to:
   receive the second in-phase receive signal and the second quadrature receive signal via the second in-phase port and the second quadrature port, respectively; and
   output the selected second receive signal via the second input port.

5. The diplexer circuit of claim 3 wherein the filter circuit comprises:
a first bandpass filter coupled between the first in-phase port and the second quadrature port, the first bandpass filter is configured to pass the second quadrature transmit signal and reject the first in-phase transmit signal; and
a second bandpass filter coupled between the first quadrature port and the second in-phase port, the second bandpass filter is configured to pass the second in-phase transmit signal and reject the first quadrature transmit signal.

6. The diplexer circuit of claim 5 wherein:
the first hybrid coupler is further configured to:
   receive the first transmit signal in the first transmit band via the first isolated port;
   split the first transmit signal into the first in-phase transmit signal and the first quadrature transmit signal; and
   output the first in-phase transmit signal and the first quadrature transmit signal via the first in-phase port and the first quadrature port, respectively;
the second hybrid coupler is further configured to:
   receive the second transmit signal in the second transmit band via the second input port;
   split the second transmit signal into the second in-phase transmit signal and the second quadrature transmit signal; and
   output the second in-phase transmit signal and the second quadrature transmit signal via the second in-phase port and the second quadrature port, respectively; and
the first hybrid coupler is further configured to output the transmit signal comprising the first transmit signal in the first transmit band and the second transmit signal in the second transmit band via the first input port.

7. The diplexer circuit of claim 6 wherein the first transmit band has a wider fractional bandwidth than the second transmit band.

8. The diplexer circuit of claim 6 wherein the first transmit band corresponds to fifth-generation new radio (5G-NR) band 77 and the second transmit band corresponds to 5G-NR band 79.

9. The diplexer circuit of claim 5 wherein:
the first bandpass filter is further configured to pass the second in-phase receive signal and reject the first in-phase receive signal; and
the second bandpass filter is further configured to pass the second quadrature receive signal and reject the first quadrature receive signal.

10. The diplexer circuit of claim 9 wherein:
the first hybrid coupler is further configured to:
   receive the receive signal comprising the first receive signal in the first receive band and the second receive signal in the second receive band via the first input port;
   split the receive signal into the first in-phase receive signal, the first quadrature receive signal, the second in-phase receive signal, and the second quadrature receive signal;
   output the first in-phase receive signal and the second in-phase receive signal via the first in-phase port;
   output the first quadrature receive signal and the second quadrature receive signal via the first quadrature port; and
   output the first receive signal via the first isolated port; and
the second hybrid coupler is further configured to:
   receive the second in-phase receive signal and the second quadrature receive signal via the second quadrature port and the second in-phase port, respectively; and
   output the second receive signal via the second input port.

11. The diplexer circuit of claim 10 wherein the first receive band has a wider fractional bandwidth than the second receive band.

12. The diplexer circuit of claim 10 wherein the first transmit band corresponds to fifth-generation new radio (5G-NR) band 77 and the second transmit band corresponds to 5G-NR band 79.

13. The diplexer circuit of claim 3 wherein the filter circuit comprises:
a first bandstop filter coupled between the first in-phase port and the second quadrature port, the first bandstop filter is configured to stop the second in-phase receive signal and pass the first quadrature receive signal; and
a second bandstop filter coupled between the first quadrature port and the second in-phase port, the second bandstop filter is configured to pass the first in-phase receive signal and reject the second quadrature receive signal.

14. The diplexer circuit of claim 13 wherein:
the first hybrid coupler is further configured to:
   receive the second transmit signal in the second transmit band via the first isolated port;
   split the second transmit signal into the second in-phase transmit signal and the second quadrature transmit signal; and
   output the second in-phase transmit signal and the second quadrature transmit signal via the first in-phase port and the first quadrature port, respectively;
the second hybrid coupler is further configured to:
   receive the first transmit signal in the first transmit band via the second input port;
   split the first transmit signal into the first in-phase transmit signal and the first quadrature transmit signal; and output the first in-phase transmit signal and the first quadrature transmit signal via the second in-phase port and the second quadrature port, respectively; and the first hybrid coupler is further configured to output the transmit signal comprising the first transmit signal in the first transmit band and the second transmit signal in the second transmit band via the first input port.

15. The diplexer circuit of claim 14 wherein the second transmit band corresponds to a wider fractional bandwidth than the first transmit band.

16. The diplexer circuit of claim 15 wherein the first transmit band corresponds to fifth-generation new radio (5G-NR) band 79 and the second transmit band corresponds to 5G-NR band 77.

17. The diplexer circuit of claim 13 wherein:
the first bandstop filter is further configured to pass the first in-phase receive signal and reject the second in-phase receive signal; and
the second bandstop filter is further configured to pass the first quadrature receive signal and reject the second quadrature receive signal.

18. The diplexer circuit of claim 17 wherein:
the first hybrid coupler is further configured to:
receive the receive signal comprising the first receive signal in the first receive band and the second receive signal in the second receive band via the first input port;
split the receive signal into the first in-phase receive signal, the first quadrature receive signal, the second in-phase receive signal, and the second quadrature receive signal;
output the first in-phase receive signal and the second in-phase receive signal via the first in-phase port;
output the first quadrature receive signal and the second quadrature receive signal via the first quadrature port; and
output the second receive signal via the first isolated port; and
the second hybrid coupler is further configured to:
receive the first in-phase receive signal and the first quadrature receive signal via the second quadrature port and the second in-phase port, respectively; and
output the first receive signal via the second input port.

19. The diplexer circuit of claim 18 wherein the second receive band corresponds to a wider fractional bandwidth than the first receive band.

20. The diplexer circuit of claim 18 wherein the first transmit band corresponds to fifth-generation new radio (5G-NR) band 79 and the second transmit band corresponds to 5G-NR band 77.

21. The diplexer circuit of claim 1 further comprising a switching circuit coupled between the first hybrid coupler and the filter circuit, the switching circuit is configured to bypass the filter circuit and the second hybrid coupler.

22. The diplexer circuit of claim 21 wherein the switching circuit comprises a first shunt switch and a second shunt switch configured to form a pair of shunt paths between the first in-phase port and the first quadrature port and a ground, respectively.

23. The diplexer circuit of claim 21 wherein the switching circuit comprises a first switch and a second switch configured to:
couple the first in-phase port and the first quadrature port to the filter circuit, respectively; and
decouple the first in-phase port and the first quadrature port from the filter circuit, respectively.

24. An apparatus comprising:
a transceiver circuit configured to generate a first transmit signal in a first transmit band and a second transmit signal in a second transmit band; and
a diplexer circuit comprising:
a first hybrid coupler comprising a first input port, a first isolated port, a first in-phase port, and a first quadrature port, the first hybrid coupler configured to receive and split a selected first transmit signal among the first transmit signal and the second transmit signal into a first in-phase transmit signal and a first quadrature transmit signal each corresponding to a first fractional bandwidth;
a second hybrid coupler comprising a second input port, a second isolated port, a second in-phase port, and a second quadrature port, the second hybrid coupler configured to receive and split a selected second transmit signal among the first transmit signal and the second transmit signal into a second in-phase transmit signal and a second quadrature transmit signal each corresponding to a second fractional bandwidth smaller than the first fractional bandwidth; and
a filter circuit coupled between the first hybrid coupler and the second hybrid coupler, the filter circuit configured to:
pass the second in-phase transmit signal and the second quadrature transmit signal to the first hybrid coupler; and
reflect the first in-phase transmit signal and the first quadrature transmit signal to the first hybrid coupler; and
wherein the first hybrid coupler is further configured to output a transmit signal comprising the first transmit signal in the first transmit band and the second transmit signal in the second transmit band based on the first in-phase transmit signal, the first quadrature transmit signal, the second in-phase transmit signal, and the second quadrature transmit signal.

25. The apparatus of claim 24 wherein:
the first hybrid coupler is further configured to:
receive a receive signal comprising a first receive signal in a first receive band and a second receive signal in a second receive band; and
split the receive signal into a first in-phase receive signal, a first quadrature receive signal, a second in-phase receive signal, and a second quadrature receive signal;
the filter circuit is further configured to:
reflect a selected first in-phase receive signal among the first in-phase receive signal and the second in-phase receive signal and a selected first quadrature receive signal among the first quadrature receive signal and the second quadrature receive signal to the first hybrid coupler; and
pass a selected second in-phase receive signal among the first in-phase receive signal and the second in-phase receive signal and a selected second quadrature receive signal among the first quadrature receive signal and the second quadrature receive signal to the second hybrid coupler; and
the first hybrid coupler is further configured to output a selected first receive signal based on the selected first in-phase receive signal and the selected first quadrature receive signal;
the second hybrid coupler is further configured to output a selected second receive signal based on the selected second in-phase receive signal and the selected second quadrature receive signal; and the transceiver circuit is further configured to receive the selected first receive signal and the selected second receive signal from the first hybrid coupler and the second hybrid coupler, respectively.

26. The apparatus of claim 25 wherein:

the filter circuit comprises:
- a first bandpass filter coupled between the first in-phase port and the second quadrature port, the first bandpass filter is configured to:
  - pass the second quadrature transmit signal and reject the first in-phase transmit signal; and
  - pass the second in-phase receive signal and reject the first in-phase receive signal; and
- a second bandpass filter coupled between the first quadrature port and the second in-phase port, the second bandpass filter is configured to:
  - pass the second in-phase transmit signal and reject the first quadrature transmit signal; and
  - pass the second quadrature receive signal and reject the first quadrature receive signal; and the transceiver circuit is further configured to:
- provide the first transmit signal and the second transmit signal to the first isolated port and the second input port, respectively; and
- receive the first receive signal and the second receive signal from the first isolated port and the second input port, respectively.

27. The apparatus of claim 26 wherein:

the first transmit band has a wider fractional bandwidth than the second transmit band; and the first receive band has a wider fractional bandwidth than the second receive band.

28. The apparatus of claim 25 wherein the filter circuit comprises:
- a first bandstop filter coupled between the first in-phase port and the second quadrature port, the first bandstop filter is configured to:
  - stop the second in-phase receive signal and pass the first quadrature receive signal; and
  - pass the first in-phase receive signal and reject the second in-phase receive signal; and
- a second bandstop filter coupled between the first quadrature port and the second in-phase port, the second bandstop filter is configured to:
  - pass the first in-phase receive signal and reject the second quadrature receive signal; and
  - pass the first quadrature receive signal and reject the second quadrature receive signal; and the transceiver circuit is further configured to:
- provide the second transmit signal and the first transmit signal to the first isolated port and the second input port, respectively; and
- receive the second receive signal and the first receive signal from the first isolated port and the second input port, respectively.

29. The apparatus of claim 28 wherein:

the second transmit band corresponds to a wider fractional bandwidth than the first transmit band; and the second receive band corresponds to a wider fractional bandwidth than the first receive band.

30. The apparatus of claim 24 wherein the diplexer circuit further comprises a switching circuit coupled between the first hybrid coupler and the filter circuit, the switching circuit is configured to bypass the filter circuit and the second hybrid coupler.

31. The apparatus of claim 30 wherein the switching circuit comprises a first shunt switch and a second shunt switch configured to form a pair of shunt paths between the first in-phase port and the first quadrature port and a ground, respectively.

32. The apparatus of claim 30 wherein the switching circuit comprises a first switch and a second switch configured to:
- couple the first in-phase port and the first quadrature port to the filter circuit, respectively; and
- decouple the first in-phase port and the first quadrature port from the filter circuit, respectively.

* * * * *

UNITED STATES PATENT AND TRADEMARK OFFICE
CERTIFICATE OF CORRECTION

PATENT NO. : 10,735,045 B2
APPLICATION NO. : 16/103171
DATED : August 4, 2020
INVENTOR(S) : Nadim Khlat and Marcus Granger-Jones It is certified that error appears in the above-identified patent and that said Letters Patent is hereby corrected as shown below:

In the Specification

Column 8, Lines 30 and 51, replace "second transmit band $B_{RX2}$" with --second transmit band $B_{TX2}$--.

Signed and Sealed this
Fifteenth Day of September, 2020

Andrei Iancu
*Director of the United States Patent and Trademark Office*